United States Patent
Kubo et al.

(10) Patent No.: US 10,790,152 B2
(45) Date of Patent: Sep. 29, 2020

(54) METHOD FOR ETCHING MULTILAYER FILM

(71) Applicant: TOKYO ELECTRON LIMITED, Tokyo (JP)

(72) Inventors: Takuya Kubo, Tokyo (JP); Song yun Kang, Tokyo (JP); Tamotsu Morimoto, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/740,394

(22) PCT Filed: Jul. 15, 2016

(86) PCT No.: PCT/JP2016/071053
§ 371 (c)(1),
(2) Date: Dec. 28, 2017

(87) PCT Pub. No.: WO2017/018256
PCT Pub. Date: Feb. 2, 2017

(65) Prior Publication Data
US 2018/0190500 A1    Jul. 5, 2018

(30) Foreign Application Priority Data
Jul. 29, 2015  (JP) ................. 2015-149273

(51) Int. Cl.
*H01L 21/3065*    (2006.01)
*H01L 43/12*    (2006.01)
(Continued)

(52) U.S. Cl.
CPC ........... *H01L 21/3065* (2013.01); *C23F 4/00* (2013.01); *H01L 21/32136* (2013.01);
(Continued)

(58) Field of Classification Search
CPC .......... H01L 21/3065; H01L 21/32136; H01L 43/12; H01L 43/08; H01L 27/105; C23F 4/00
See application file for complete search history.

(56) References Cited

U.S. PATENT DOCUMENTS 4,557,796 A    12/1985  Druschke et al.
5,846,884 A *  12/1998  Naeem .............. H01L 21/32136
                                                          438/714
(Continued)

OTHER PUBLICATIONS

S. Wolf and R.N. Tauber, (Silicon Processing for the VLSI Era, vol. 1—Process Technology, Lattice Press, 1986)(pp. 542-557). (Year: 1986).*

(Continued)

*Primary Examiner* — Duy Vu N Deo
*Assistant Examiner* — Mahmoud Dahimene
(74) *Attorney, Agent, or Firm* — Rothwell, Figg, Ernst & Manbeck, P.C.

(57) ABSTRACT

In a method for etching a multilayer film of a target object by using a plasma processing apparatus, the multilayer film of the target object includes a layer made of a metal magnetic material and a mask is provided on the multilayer film. The multilayer film is etched in a state where a pressure in a processing chamber of the plasma processing apparatus is set to a first pressure that is a relatively high pressure. Subsequently, the multilayer film is further etched in a state where the pressure in the processing chamber is set to a second pressure lower than the first pressure.

7 Claims, 9 Drawing Sheets

(51) Int. Cl.
*H01L 43/08* (2006.01)
*C23F 4/00* (2006.01)
*H01L 21/3213* (2006.01)
*H01L 43/10* (2006.01)

(52) U.S. Cl.
CPC .............. *H01L 43/08* (2013.01); *H01L 43/10* (2013.01); *H01L 43/12* (2013.01)

(56) References Cited

U.S. PATENT DOCUMENTS

| | | | | |
|---|---|---|---|---|
| 6,228,754 B1 | * | 5/2001 | Iacoponi | ........... H01L 21/76843 257/E21.584 |
| 2003/0099069 A1 | * | 5/2003 | Kagami | ................. B82Y 10/00 360/313 |

OTHER PUBLICATIONS

International Search Report dated Oct. 18, 2016 in PCT/JP2016/071053 (4 pages).

* cited by examiner

FIG.7

| SAMPLE No. | PRESSURE (mTorr) | TIME(sec) | HIGH FREQUENCY POWER(w) | SEPARATION OR CRACKING OF MULTILAYER FILM |
|---|---|---|---|---|
| 1 | 10 | 365 | 200/800 | NON-EXISTENCE |
| 2 | 10 | 365 | 200/800 | EXISTENCE |
| 3 | 10 | 425 | 200/800 | EXISTENCE |
| 4 | 10 | 375 | 200/800 | EXISTENCE |
| 5 | 10 | 325 | 200/800 | EXISTENCE |
| 6 | 15 | 425 | 200/800 | NON-EXISTENCE |
| 7 | 15 | 425 | 200/800 | NON-EXISTENCE |
| 8 | 15 | 425 | 200/800 | NON-EXISTENCE |
| 9 | 15 | 425 | 200/800 | NON-EXISTENCE |
| 10 | 15/10 | 15/360 | 200/800 | NON-EXISTENCE |
| 11 | 15/10 | 15/360 | 200/800 | NON-EXISTENCE |
| 12 | 15/10 | 15/360 | 200/800 | EXISTENCE |
| 13 | 15/10 | 100/275 | 200/800 | NON-EXISTENCE |
| 14 | 15/10 | 100/275 | 200/800 | NON-EXISTENCE |
| 15 | 15/10 | 100/275 | 200/800 | NON-EXISTENCE |
| 16 | 15/10 | 100/275 | 200/800 | NON-EXISTENCE |
| 17 | 15/10 | 100/275 | 200/800 | NON-EXISTENCE |
| 18 | 15/10 | 100/275 | 200/800 | NON-EXISTENCE |
| 19 | 15/10 | 100/275 | 200/800 | NON-EXISTENCE |
| 20 | 15/10 | 100/275 | 200/800 | NON-EXISTENCE |
| 21 | 15/10 | 122/253 | 200/800 | NON-EXISTENCE |
| 22 | 15/10 | 122/253 | 200/800 | NON-EXISTENCE |
| 23 | 15/10 | 122/253 | 200/800 | NON-EXISTENCE |

METHOD FOR ETCHING MULTILAYER FILM

CROSS REFERENCE TO RELATED APPLICATION(S)

This application is a 35 U.S.C. 371 National Phase Entry Application from PCT/JP2016/071053, filed on Jul. 15, 2016, which claims priority to Japanese Patent Application No. 2015-149273, filed on Jul. 29, 2015, the disclosures of which are incorporated herein in their entirety by reference.

FIELD OF THE INVENTION

The present invention relates to a method for etching a multilayer film including a layer made of a metallic magnetic material by using a plasma processing apparatus.

BACKGROUND OF THE INVENTION

In manufacturing electronic devices, plasma etching is performed to form a fine structure. The plasma etching includes etching mainly using reaction of active species and sputter etching mainly using impact of ions. Especially, the sputter etching is used for etching of a hard-to-etch material such as a metallic material.

In the sputter etching, a pressure in a processing chamber of a plasma processing apparatus is generally set to a low level of 10 mTorr or less. Under a low pressure condition, energy and linearity of ions are improved and, thus, a high etching rate and a high etching anisotropy are obtained. Such an etching under a low pressure condition is disclosed in, e.g., U.S. Pat. No. 4,557,796.

Since a multilayer film including a layer made of a metallic magnetic material contains a hard-to-etch material, the sputter etching may be used for etching of the multilayer film. The etching of the multilayer film may be performed in manufacturing a magnetic storage device, e.g., MRAM (Magnetoresistive Random Access Memory) or the like.

However, in the case of performing the sputter etching on the multilayer film under a low pressure condition, separation and/or cracking of the multilayer film may occur. In the sputter etching, it is required to suppress the separation and the cracking of the multilayer film while suppressing decrease of etching rate and decrease of etching anisotropy.

SUMMARY OF THE INVENTION

In accordance with an aspect, there is provided a method for etching a multilayer film of a target object by using a plasma processing apparatus. The target object comprises the multilayer film including a layer made of a metal magnetic material and a mask provided on the multilayer film. The method includes: (i) a first step of performing sputter etching on the multilayer film in a state where a pressure in a processing chamber of the plasma processing apparatus is set to a first pressure; and (ii) a second step of performing sputter etching on the multilayer film in a state where a pressure in a processing chamber of the plasma processing apparatus is set to a second pressure lower than the first pressure.

It is assumed that separation and/or cracking of the multilayer film occur during the sputter etching under a low pressure condition for the following reasons. Organic impurities may penetrate into a boundary surface between different films in the multilayer film or a boundary surface between the multilayer film and an underlaying layer thereof. When organic impurities react with active species generated in the plasma, a gas is generated in the boundary surface to form a gas-containing defect. If the difference between the pressure in the defect and the pressure in the processing chamber is great, that is, under a low pressure condition, the gas in the defect is expanded to apply a great stress to the multilayer film. As a result, separation and/or cracking of the multilayer film occur.

In the first step of the method described above, the pressure in the processing chamber is set to a comparatively high pressure. That is, the difference between the pressure in the defect and the pressure in the processing chamber is decreased. Accordingly, in the first step, the expansion of the gas in the defect is suppressed. Further, in the first step, the gas in the defect leaks from the multilayer film during the sputter etching. Therefore, in the first step and the subsequent second step, separation and/or cracking of the multilayer film is suppressed. Further, in this method, after the first step has been performed, the sputter etching is further performed under a comparatively low pressure in the second step. Accordingly, a high etching rate is obtained and the etching having high anisotropy in the laminated direction of the multilayer film is performed.

In one embodiment, the first pressure may be set to 2 Pa (15 mTorr) or above. Further, in one embodiment, the second pressure may be set to 1.333 Pa (10 mTorr) or less. In addition, in one embodiment, the multilayer film may contain two or more metals selected among Ru, Ta, Pt, Pd, Ti, Mg, Al, Ag, Au, Cu, W, Co, Fe and Ni. Furthermore, in one embodiment, a mounting table including a lower electrode may be provided in the processing chamber, and, in the first step, a high frequency bias power may be supplied to the lower electrode in a state where the target object is mounted on the mounting table. That is, in the first step, a comparatively high pressure for the sputter etching is set, and a high frequency power is used for attracting ions in the sputter etching.

In one embodiment, the first step is executed until a film thickness of the multilayer film becomes 31 nm or less. By performing the etching until the film thickness of the multilayer film becomes 31 nm or less, the gas in the defect easily leaks from the multilayer film. Therefore, the separation and/or the cracking of the multilayer film is further suppressed.

Effect of the Invention

As described above, the separation and the cracking of the multilayer film by the etching are suppressed and the deterioration of the etching rate and the deterioration of the etching anisotropy are suppressed.

BRIEF DESCRIPTION OF THE DRAWINGS

FIG. 7 is a table showing various conditions and results of tests.

DETAILED DESCRIPTION OF THE EMBODIMENTS

Figure 1:
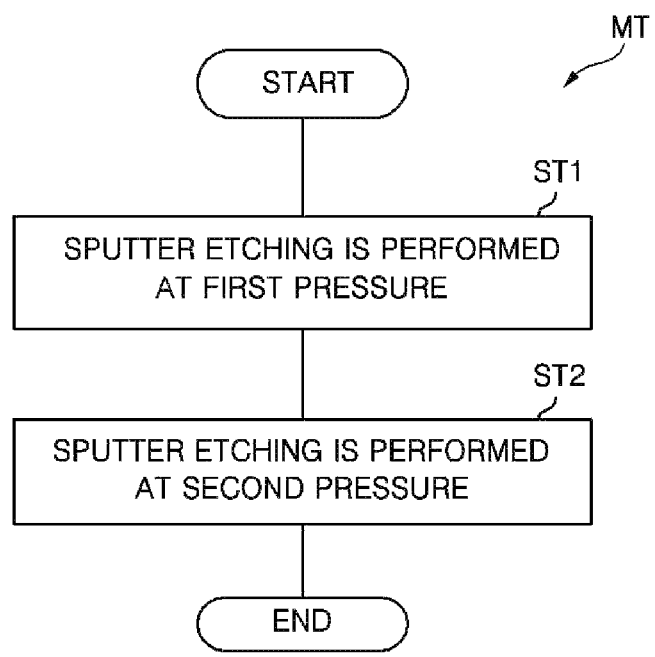
FIG. 1 is a flowchart showing a method for etching a multilayer film according to an embodiment.

Hereinafter, various embodiments will be described in detail with reference to the accompanying drawings. Like reference numerals will be given to like or corresponding parts throughout the drawings.

FIG. 1 is a flowchart showing a method for etching a multilayer film according to an embodiment. A method MT shown in FIG. 1 is a method for etching a multilayer film including a layer of made of a metal magnetic material by using a plasma processing apparatus.

Figure 2:
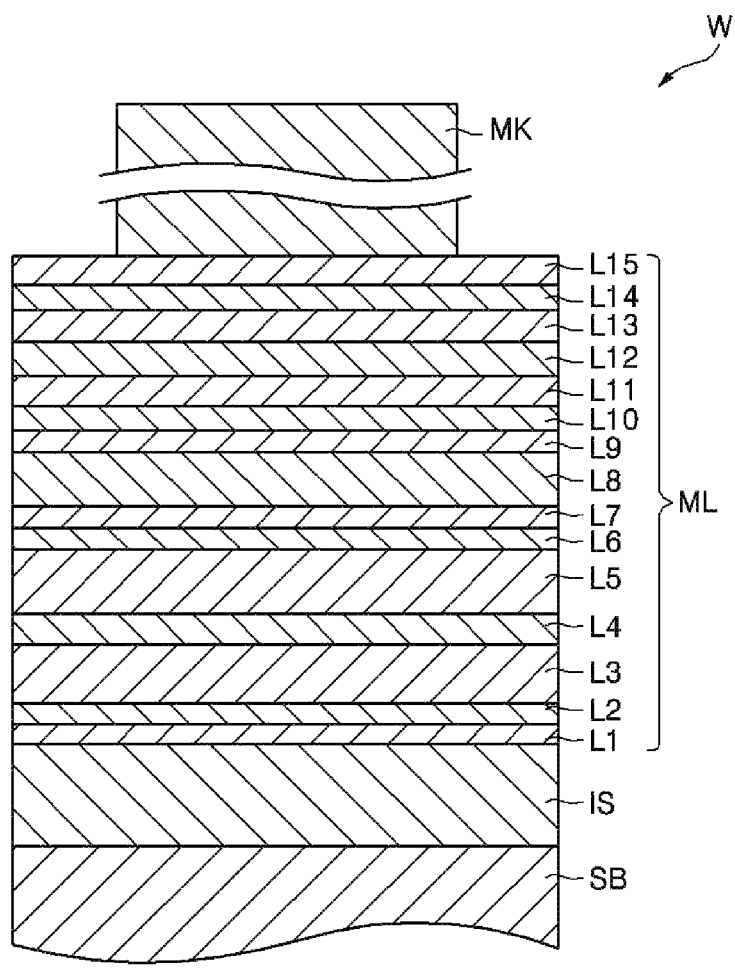
FIG. 2 is a cross sectional view showing a part of a target object as an example to which the method shown in FIG. 1 can be applied.

FIG. 2 is a cross sectional view showing a part of a target object as an example to which the method shown in FIG. 1 can be applied. As shown in FIG. 2, the target object, e.g., a wafer W, includes a substrate SB, an insulating film IS, a multilayer film ML and a mask MK. The wafer W is obtained during a process of manufacturing, e.g., a MRAM (Magnetoresistive Random Access Memory). The insulating film IS is formed on the substrate SB. The insulating film IS is made of, e.g., silicon oxide or silicon nitride. The multilayer film ML is formed on the insulating film IS.

The multilayer film ML comprises a plurality of layers including a layer made of a metal magnetic material. For example, as shown in FIG. 2, the multilayer film ML includes a first to a fifteenth layer L1 to L15. Each of the first to the fifteenth layer L1 to L15 is a metallic layer. The first layer L1 is the lowermost layer, i.e., a layer provided closest to the insulating film IS, and is made of Ta. The second layer L2 is formed on the first layer L1 and made of Ru. The third layer L3 is formed on the second layer L2 and made of Ta. The fourth layer L4 is formed on the third layer L3 and made of Pt. The fifth layer L5 is formed on the fourth layer L4 and made of Pt and Co. The sixth layer L6 is formed on the fifth layer L5 and made of Co. The seventh layer L7 is formed on the sixth layer L6 and made of Ru. The eighth layer L8 is formed on the seventh layer L7 and made of Pt and Co. The ninth layer L9 is formed on the eighth layer L8 and made of Co. The tenth layer L10 is formed on the ninth layer L9 and made of Ta. The eleventh layer L11 is formed on the tenth layer L10 and made of CoFeB. The twelfth layer L12 is formed on the eleventh layer L11 and made of MgO. The thirteenth layer L13 is formed on the twelfth layer L12 and made of CoFeB. The fourteenth layer L14 is formed on the thirteenth layer L13 and made of Ta. The fifteenth layer L15 is formed on the fourteenth layer L14 and made of Ru. The fifth layer L5 and the eighth layer L8 have a structure in which a Pt thin film and a Co thin film are alternately laminated. Specifically, the fifth layer L5 has a structure in which six Pt thin films and Co thin films are alternately laminated and the eighth layer L8 has a structure in which two Pt thin films and two Co thin films are alternately laminated.

The first layer L1 and the second layer L2 of the multilayer film ML constitute a lower electrode. The third layer L3 and the fourth layer L4 serve as a seed layer for allowing films to grow upward. The fifth layer L5 and the sixth layer L6 constitute an antiferromagnetic layer. The seventh layer L7 is used as a spacer between the antiferromagnetic layer and a magnetization pinned layer formed thereon. The eighth layer L8, the ninth layer L9, the tenth layer L10 and the eleventh layer L11 constitute the magnetization pinned layer. The twelfth layer L12 serves as a tunnel barrier layer. The thirteenth layer L13 serves as a magnetization free layer. The fourteenth layer L14 and the fifteenth layer L15 constitute an upper electrode. The magnetization pinned layer, the tunnel barrier layer and the magnetization free layer constitute a magnetic tunnel junction (MTJ).

The followings are examples of the thicknesses of the respective layers of the multilayer film ML. The first layer L1 has a thickness of 5 nm; the second layer L2 has a thickness of 5 nm; the third layer L3 has a thickness of 10 nm; the fourth layer L4 has a thickness of 5 nm; the fifth layer L5 has a thickness of 4.8 nm; the sixth layer L6 has a thickness of 0.5 nm; the seventh layer L7 has a thickness of 0.9 nm; the eighth layer L8 has a thickness of 1.6 nm; the ninth layer L9 has a thickness of 0.5 nm; the tenth layer L10 has a thickness of 0.4 nm; the eleventh layer L11 has a thickness of 1.2 nm; the twelfth layer L12 has a thickness of 1.3 nm; the thirteenth layer L13 has a thickness of 1.6 nm; the fourteenth layer L14 has a thickness of 5 nm; and the fifteenth layer L15 has a thickness of 5 nm.

The mask MK is provided on the multilayer film ML. The mask MK is made of a metal-containing film. The metal-containing film is made of, e.g., Ta, TiN or the like. A pattern of the mask MK may be formed by plasma etching.

The structure of the wafer W shown in FIG. 2 and the thickness of the respective layers are examples. The method MT may be applied to another target object other than the wafer W shown in FIG. 2. The respective layers of the multilayer film ML may include layers made of one or more metals selected among Ru, Ta, Pt, Pd, Ti, Mg, Al, Ag, Au, Cu, W, Co, Fe and Ni. The multilayer film ML may include a layer made of an alloy of two or more metals selected among those materials.

Figure 3:
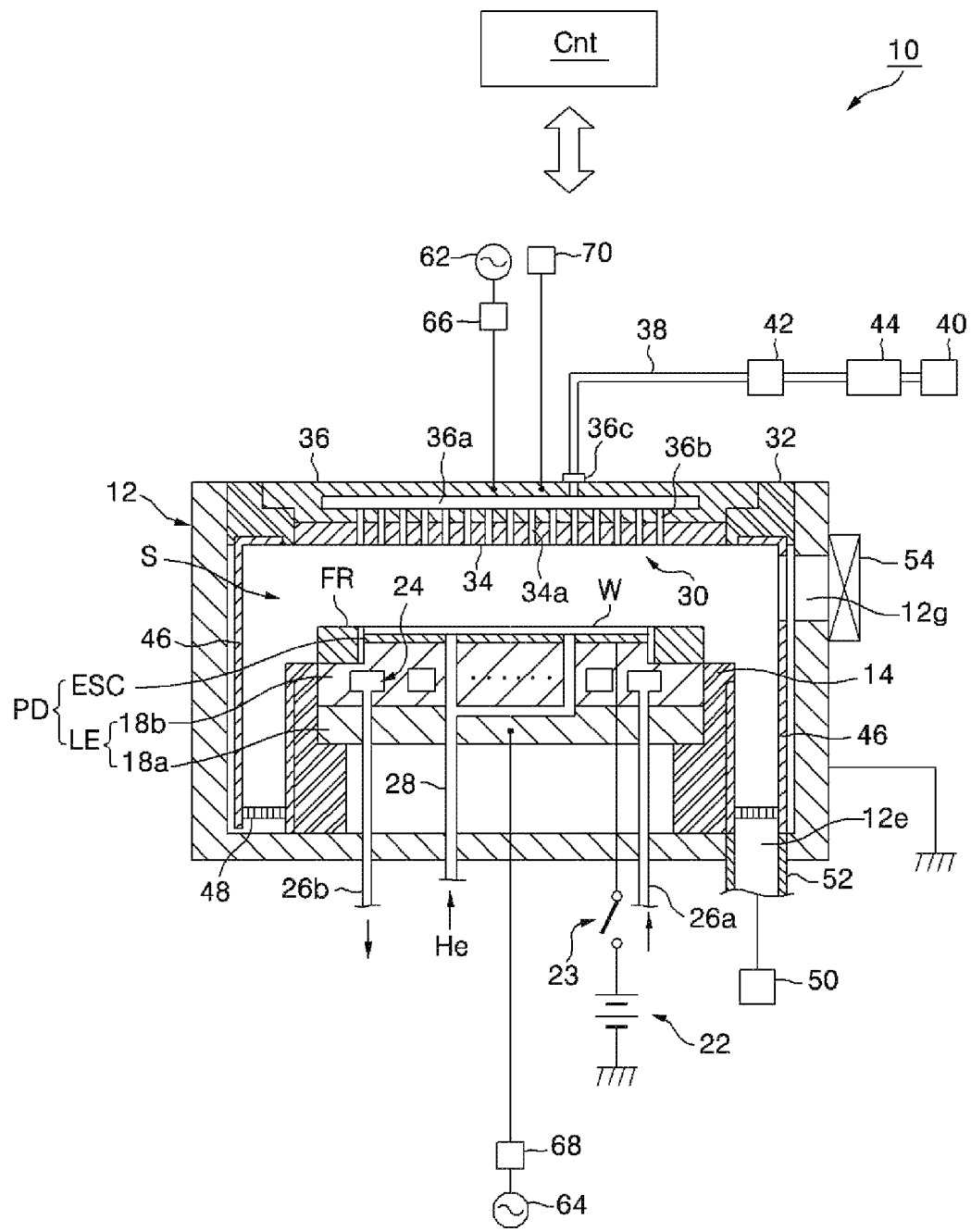
FIG. 3 schematically shows an example of a plasma processing apparatus capable of performing the method shown in FIG. 1.

In the method MT, a target object such as the wafer W shown in FIG. 2 is processed in a processing chamber of a plasma processing apparatus. FIG. 3 schematically shows an example of the plasma processing apparatus capable of performing the method MT shown in FIG. 1. A plasma processing apparatus 10 shown in FIG. 3 is a capacitively coupled plasma processing apparatus and includes a substantially cylindrical processing chamber 12. The processing chamber 12 is made of, e.g., aluminum. An inner wall surface of the processing chamber 12 may be anodically oxidized. The processing chamber 12 is frame grounded.

A substantially cylindrical supporting part 14 is provided on a bottom portion of the processing chamber 12. The supporting part 14 is made of, e.g., an insulating material. In the processing chamber 12, the supporting part 14 extends upward from the bottom portion of the processing chamber 12. A mounting table PD is provided in the processing chamber 12. The mounting table PD is supported by the supporting part 14.

The mounting table PD holds the wafer W thereon. The mounting table PD includes a lower electrode LE and an electrostatic chuck ESC. The lower electrode LE has a first plate 18a and a second plate 18b. The first plate 18a and the second plate 18b are made of a metal, e.g., aluminum, and has a substantially disc shape. The second plate 18b is provided on the first plate 18a and is electrically connected to the first plate 18a.

The electrostatic chuck ESC is provided on the second plate 18b. The electrostatic chuck ESC has a structure in which an electrode made of a conductive film is interposed between a pair of insulating layers or insulating sheets. A DC power supply 22 is electrically connected to the electrode of the electrostatic chuck ESC via a switch 23. The wafer W can be attracted and held on the electrostatic chuck ESC by an electrostatic force such as a Coulomb force generated by a DC voltage applied from the DC power supply 22.

A focus ring FR is provided on an outer periphery of the second plate 18b to surround the edge of the wafer W and the electrostatic chuck ESC. The focus ring FR is provided to improve the uniformity of the etching. The focus ring FR is made of a material that is appropriately selected depending on a material of an etching target film. For example, the focus ring FR may be made of quartz.

A coolant path 24 is provided in the second electrode 18b. The coolant path 24 constitutes a temperature control mechanism. A coolant is supplied to the coolant path 24 from a chiller unit provided outside the processing chamber 12 through a line 26a. The coolant flowing in the coolant path 24 returns to the chiller unit through a line 26b. The coolant circulates between the coolant path 24 and the chiller unit. A temperature of the wafer W held on the electrostatic chuck ESC is controlled by controlling a temperature of the coolant.

The plasma processing apparatus 10 further includes a gas supply line 28. The gas supply line 28 supplies a heat transfer gas, e.g., He gas, from a heat transfer gas supply unit to a gap between a top surface of the electrostatic chuck ESC and a backside of the wafer W.

The plasma processing apparatus 10 further includes an upper electrode 30. The upper electrode 30 is provided above the mounting table PD to face the mounting table PD. The upper electrode 30 and the lower electrode LE are approximately parallel to each other. Between the upper electrode 30 and the mounting table PD, a processing space S where plasma processing is performed on the wafer W is defined.

The upper electrode 30 is held at an upper portion of the processing chamber 12 through an insulating shield member 32. In one embodiment, a vertical distance from the top surface of the mounting table PD, i.e., a wafer mounting surface, to the upper electrode 30 may be variable. The upper electrode 30 may include a ceiling plate 34 and a holder 36. The ceiling plate 34 is in contact with the processing space S and has a plurality of gas injection holes 34a. The surface portion 34 may be made of, e.g., silicon, SiC or the like. Or, the ceiling plate 34 may be formed by forming a ceramic film on a surface of an aluminum base.

The holder 36 detachably holds the ceiling plate 34 and may be made of a conductive material, e.g., aluminum.

The holder 36 may have a water-cooling structure. A gas diffusion space 36a is provided in the holder 36. A plurality of gas holes 36b communicating with the gas injection holes 34a extends downward from the gas diffusion space 36a. A gas inlet port 36c for introducing a processing gas into the gas diffusion space 36a is formed at the holder 36. A gas supply pipe 38 is connected to the gas inlet port 36c.

A gas source group 40 is connected to the gas supply pipe 38 via a valve group 42 and a flow rate controller group 44. The gas source group 40 includes a plurality of gas sources.

The gas sources include a source of a gas used in the method MT for etching a multilayer film. For example, the gas source group 40 includes a source of a hydrocarbon-based gas and a source of a rare gas. The gas source group 40 may include gas sources for other gases, e.g., a source of alcohol, a source of nitrogen gas, a source of hydrogen gas and the like.

The valve group 42 includes a plurality of valves. The flow rate controller group 44 includes a plurality of flow rate controllers such as mass flow controllers. A plurality of gas sources of the gas source group 40 are connected to the gas supply pipe 38 via corresponding valves of the valve group 42 and corresponding flow rate controllers of the flow rate controller group 44, respectively.

In the plasma processing apparatus 10, a deposition shield 46 is detachably provided along an inner wall surface of the processing chamber 12. The deposition shield 46 is also provided at an outer periphery of the supporting part 14. The deposition shield 46 prevents etching by-products from being adhered to the processing chamber 12. The deposition shield 46 may be formed by coating ceramic such as $Y_2O_3$ or the like on an aluminum material.

A gas exhaust plate 48 having a plurality of through-holes is provided at a lower portion in the processing chamber 12 between the supporting part 14 and a sidewall of the processing chamber 12. The gas exhaust plate 48 may be formed by coating ceramic such as $Y_2O_3$ or the like on an aluminum material, for example. A gas exhaust port 12e is provided at the processing chamber 12 below the gas exhaust plate 48. A gas exhaust unit 50 is connected to the gas exhaust port 12e through a gas exhaust line 52. The gas exhaust unit 50 includes a vacuum pump such as a turbo molecular pump or the like, and thus can decrease a pressure in the processing chamber 12 to a desired vacuum level. A loading/unloading port 12g for the wafer W is provided at the sidewall of the processing chamber 12. The loading/unloading port 12g can be opened and closed by a gate valve 54.

The plasma processing apparatus 10 further includes a first high frequency power supply 62 and a second high frequency power supply 64. The first high frequency power supply 62 generates a first high frequency power for plasma generation, which has a frequency of, e.g., 27 MHz to 100 MHz. The first high frequency power supply 62 is connected to the upper electrode 30 via a matching unit 66. The matching unit 66 includes a circuit for matching an output impedance of the first high frequency power supply 62 and an input impedance of a load side. The first high frequency power supply 62 may be connected to the lower electrode LE via the matching unit 66.

The second high frequency power supply 64 generates a second high frequency bias power for attracting ions to the wafer W, which has a high frequency of, e.g., 400 kHz to 13.56 MHz. The second high frequency power supply 64 is connected to the lower electrode LE via a matching unit 68. The matching unit 68 includes a circuit for matching an output impedance of the second high frequency power supply 64 and an input impedance of a load side.

The plasma processing apparatus 10 further includes a power supply 70. The power supply 70 is connected to the upper electrode 30. The power supply 70 applies to the upper electrode 30 a voltage for attracting positive ions in the processing space S to the ceiling plate 34. In one example, the power supply 70 generates a negative DC voltage. In another example, the power supply 70 may be an AC power supply for generating an AC voltage of a relatively low frequency. The voltage applied from the power supply 80 to the upper electrode 30 may be −150V or less. In other words, the voltage applied from the power supply 70 to the upper electrode 30 may be a negative voltage having an absolute value of 150V or above.

Figure 4:
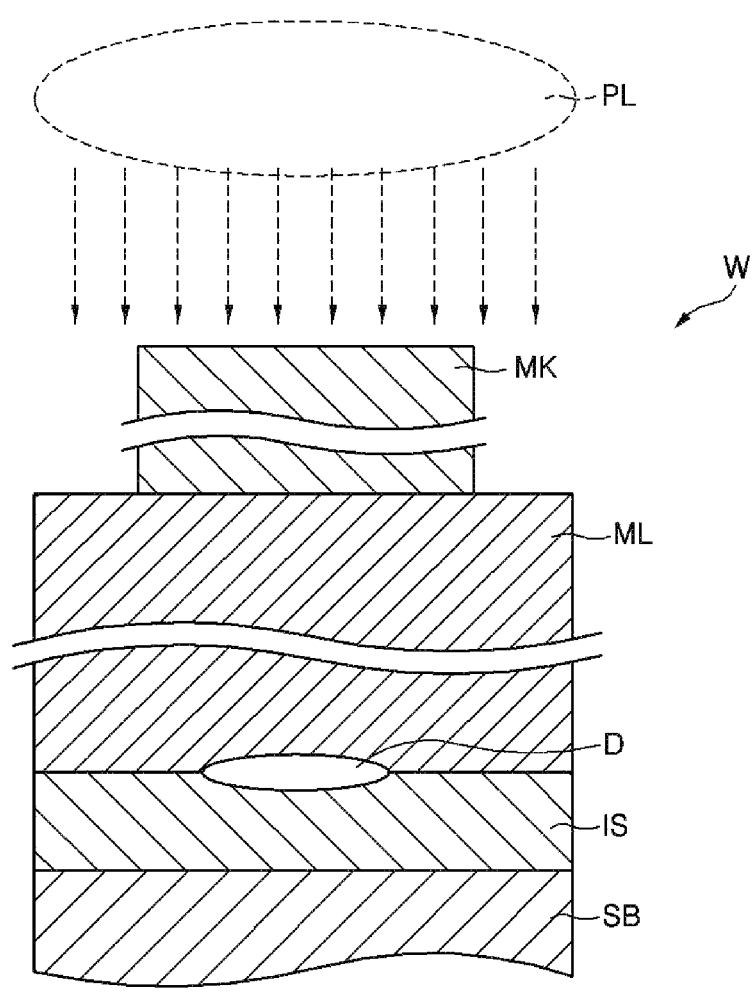
FIG. 4 is a cross sectional view showing a part of the target object in a state where a gas-containing defect D is generated between a multilayer film ML and an insulating film IS.
Figure 5:
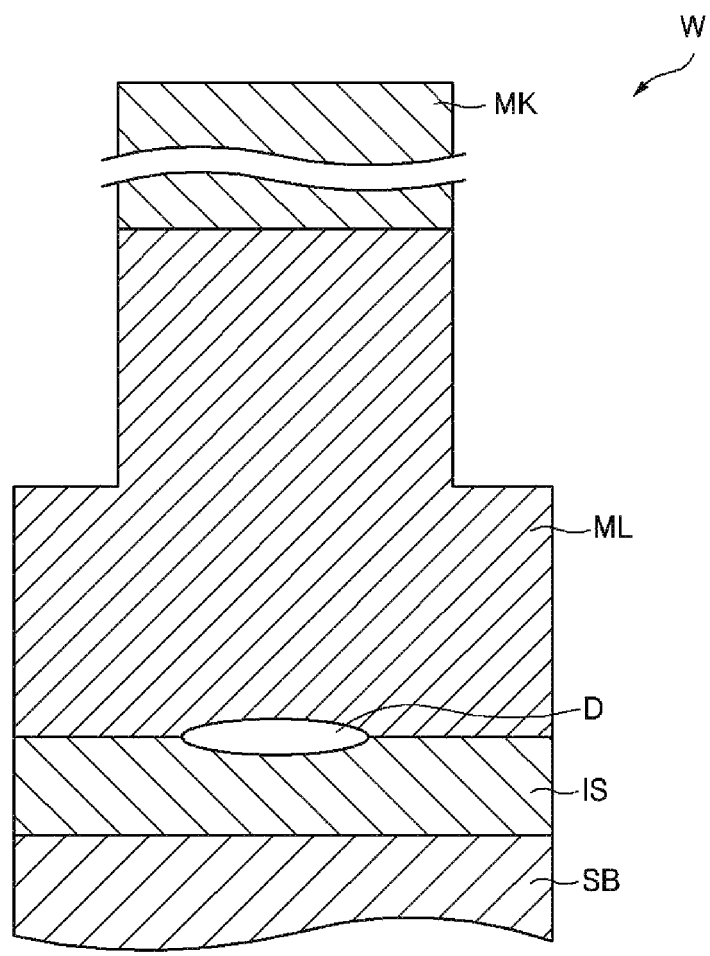
FIG. 5 is a cross sectional view showing a part of the target object after completion of a step ST1 of the method shown in FIG. 1.
Figure 6:
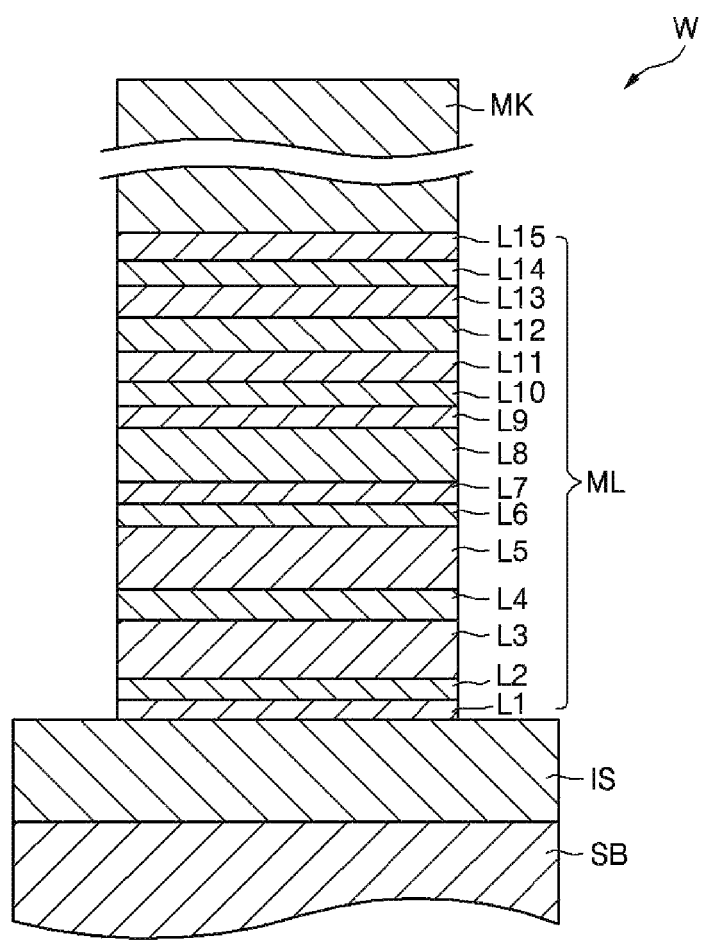
FIG. 6 is a cross sectional view showing a part of the target object after completion of a step ST2 of the method shown in FIG. 1.

In one embodiment, the plasma processing apparatus 10 may further include a control unit Cnt. The control unit Cnt is a computer including a processor, a storage unit, an input device, a display device and the like. The control unit Cnt controls the respective components of the plasma processing apparatus 10. The control unit Cnt can allow an operator to input commands to manage the plasma processing apparatus 10 through the input device and display the operation state of the plasma processing apparatus 10 on the display device. The storage unit of the control unit Cnt stores therein a control program for controlling various processes performed in the plasma processing apparatus 10, and a program, i.e., a processing recipe, for performing processes of the respective components of the plasma processing apparatus 10 based on the processing conditions. Referring back to FIG. 1, the method MT will be described in detail hereinafter. In the following description, an example in which the wafer W shown in FIG. 2 is etched by using the plasma processing apparatus 10 shown in FIG. 3 will be described. FIGS. 4 to 6 will be referred to in the following description. FIG. 4 is a cross sectional view showing a part of the target object in a state where a gas-containing defect D is generated between a multilayer film ML and an insulating film IS. FIG. 5 is a cross sectional view showing a part of the target object after completion of a step ST1 of the method shown in FIG. 1. FIG. 6 is a cross sectional view showing a part of the target object after completion of a step ST2 of the method shown in FIG. 1. In FIGS. 4 and 5, the multilayer film ML is illustrated as a single region.

In the method MT, first, the wafer W is loaded into the processing chamber 12 of the plasma processing apparatus 10 and mounted and held on the mounting table PD.

Next, a step ST1 of the method MT is executed. In the step ST1, the sputter etching of the multilayer film ML is performed in a state where a pressure in the processing chamber 12 is set to a first pressure. To do so, in the step ST1, a processing gas is supplied into the processing chamber 12 from a gas source selected among the gas sources of the gas source group 40. In one example, the processing gas contains a rare gas and a hydrocarbon-based gas. In the step ST1, the gas exhaust unit 50 operates to set the pressure in the processing chamber 12 to the first pressure. In the step ST1, the first high frequency power is supplied from the first high frequency power supply 62 to the upper electrode 30 and the second high frequency power is supplied from the second high frequency power supply 64 to the lower electrode LE.

In the step ST1, a plasma of the processing gas is generated and a portion of the multilayer film ML, which is exposed through the opening of the mask MK, is etched. During the sputter etching in the step ST1, active species such as ions or radicals in the plasma PL penetrate into the multilayer film ML and react with organic impurities, which may result in generation of the gas-containing defect D as shown in FIG. 4. Since, however, the first pressure in the processing chamber during the step ST1 is a comparatively high pressure, expansion of the defect D is suppressed such that separation and/or cracking of the multilayer film ML is suppressed. In the step ST1, as the sputter etching of the multilayer film ML progresses, the gas in the defect D leaks gradually from the multilayer film ML.

In the step ST1, the multilayer film ML is etched to an intermediate depth in a film thickness direction as shown in FIG. 5. In one embodiment, the step ST1 is executed until the film thickness of the multilayer film ML on the insulating film IS becomes 31 nm or less. By performing the etching until the film thickness of the multilayer film ML becomes 31 nm or less, the gas in the defect D easily leaks from the multilayer film ML and the pressure in the defect D is decreased. Therefore, the separation and/or the cracking of the multilayer film ML can be further suppressed.

The following is an example of various conditions in the step ST1.

Pressure in processing chamber: 15 mTorr (2 Pa) or above
    Processing gas
        $CH_4$ gas: 5 sccm to 100 sccm
        Ne gas: 50 sccm to 1000 sccm
    First high frequency power: 100 W to 1000 W
    Second high frequency power: 200 W to 2000 W Next, a step ST2 of the method MT is performed. In the step ST2, the sputter etching of the multilayer film ML is performed in a state where a pressure in the processing chamber 12 is set to a second pressure. To do so, in the step ST2, a processing gas is supplied into the processing chamber 12 from a gas source selected among the gas sources of the gas source group 40. In one example, the processing gas contains a rare gas and a hydrocarbon-based gas. The gas exhaust unit 50 operates to set the pressure in the processing chamber 12 to the second pressure. In the step ST2, the first high frequency power is supplied from the first high frequency power supply 62 to the upper electrode 30 and the second high frequency power is supplied from the second high frequency power supply 64 to the lower electrode LE.

In the step ST2, a plasma of the processing gas is generated and a portion of the multilayer film ML, which is exposed through the opening of the mask MK, is etched. The step ST2 is executed until the surface of the insulating film IS is exposed as shown in FIG. 6.

Although the second pressure in the processing chamber 12 during the step ST2 is a comparatively low pressure, the gas in the defect D is decreased by the execution of the step ST1, so that the separation and/or the cracking of the multilayer film ML is suppressed even under the lower pressure condition of the step ST2.

Since the second pressure is lower than the first pressure, the energy of ions incident on the multilayer film ML in the step ST2 becomes greater than the energy of ions incident on the multilayer film ML in the step ST1. Further, an incident angle of ions to the multilayer film ML in the step ST2 becomes smaller than an incident angle of ions to the multilayer film ML in the step ST1. Accordingly, in the step ST2, a high etching rate is obtained and the etching having high anisotropy in the laminated direction of the multilayer film ML can be performed.

The following is an example of various conditions in the step ST2.

Pressure in processing chamber: 10 mTorr (1.333 Pa) or less
    Processing gas
        $CH_4$ gas: 5 sccm to 100 sccm
        Ne gas: 50 sccm to 1000 sccm
    First high frequency power: 100 W to 1000 W
    Second high frequency power: 200 W to 2000 W While the embodiments have been described, various modifications can be made without being limited to the above embodiments. For example, the method MT can be performed by any plasma processing apparatus such as an inductively coupled plasma processing apparatus or a plasma processing apparatus for generating a plasma by using a surface wave such as a microwave.

Hereinafter, a test performed to examine the effect of the method MT will be described. The present invention is not restricted by the following test.

In the test, samples of No. 1 to No. 23, each having the same structure as that of the wafer W shown in FIG. 2, were prepared. In other words, in each sample, the substrate SB was made of Si; the insulating film IS was made of $SiO_2$. Further, in each sample, the first layer L1 was made of Ta and had a thickness of 5 nm. The second layer L2 was made of Ru and had a thickness of 5 nm. The third layer L3 was made of Ta and had a thickness of 10 nm. The fourth layer L4 was made of Pt and had a thickness of 5 nm. The fifth layer L5 had a structure in which six Pt thin films and six Co thin films are alternately laminated, each Pt thin film having a thickness of 0.3 nm and each Co thin film having a thickness of 0.5 nm. A total thickness of the fifth layer L5 was 4.8 nm. The sixth layer L6 was made of Co and had a thickness of 0.5 nm. The seventh layer L7 was made of Ru and had a thickness of 0.9 nm. The eighth layer L8 had a structure in which two Pt thin films and two Co thin films are alternately laminated, each Pt thin film having a thickness of 0.3 nm and each Co thin film having a thickness of 0.5 nm. A total thickness of the eighth layer L8 was 1.6 nm. The ninth layer L9 was made of Co and had a thickness of 0.5 nm. The tenth layer L10 was made of Ta and had a thickness of 0.4 nm. The eleventh layer L11 was made of CoFeB and had a thickness of 1.2 nm. The twelfth layer L12 was made of MgO and had a thickness of 1.3 nm. The thirteenth layer L13 was made of CoFeB and had a thickness of 1.6 nm. The fourteenth layer L14 was made of Ta and had a thickness of 5 nm. The fifteenth layer L15 was made of Ru and had a thickness of 5 nm.

In this test, the sputter etching was performed on each sample by using the plasma processing apparatus 10 shown in FIG. 3. In the sputter etching, a gaseous mixture of a methane gas and a rare gas was used as a processing gas. The table shown in FIG. 7 shows other conditions in the test. In this table, the second row from the left shows a pressure in the processing chamber 12 during the sputter etching on the respective samples. The expression "15/10" in the second row from the left in the table indicates that a pressure in the processing chamber 12 in the step ST1 was 15 mTorr and a pressure in the processing chamber 12 in the step ST2 was 10 mTorr. In this table, the third row from the left shows a period of the sputter etching for the samples. The expression "A/B" in the third row from the left in the table indicates that the step ST1 was executed for A sec and the step ST2 was executed for B sec. In this table, the fourth row from the left shows a first high frequency power and a second high frequency power during the sputter etching on the respective samples. The expression "200/800" in the fourth row from the left in this table indicates that the first high frequency power was 200 W and the second high frequency power was 800 W.

As can be seen from the table shown in FIG. 7, in this test, the sputter etching was performed on the samples of No. 1 to No. 9 in a state where the pressure in the processing chamber 12 was set to a low level, i.e., 10 mTorr. Further, the sputter etching was performed on the samples of No. 10 to No. 23 in a state where the pressure in the processing chamber 12 was set to a high level, i.e., 15 mTorr, and then further performed in a state where the pressure in the processing chamber 12 was set to a low level, i.e., 10 mTorr.

The processed samples were monitored by using an optical microscope and it was determined whether or not separation and cracking of the multilayer film occurred. The result is shown in the rightmost row in the table shown in FIG. 7. In the rightmost row in the table shown in FIG. 7, the expression "existence" indicates that the separation or the cracking of the multilayer film occurred and the expression "non-existence" indicates that the separation and the cracking of the multilayer film did not occur. As shown in the table of FIG. 7, in the sputtering etching of the samples of No. 1 to No. 9, the possibility of occurrence of separation or cracking of the multilayer film was high. In the sputtering etching of the samples of No. 10 to No. 23, the possibility of occurrence of separation and cracking of the multilayer film was low. From this result, it is clear that the separation or the cracking of the multilayer film can be suppressed by performing sputter etching in a state where a pressure in the processing chamber 12 is set to a high level and then performing sputter etching in a state where a pressure in the processing chamber 12 is set to a low level.

Next, two sets of samples which are respectively identical to the samples of No. 1 to No. 23 were prepared. Then, the sputter etching was performed on the two sets of the samples by using the plasma processing apparatus 10. In the sputter etching, a gaseous mixture of methane gas and Ne gas was used as a processing gas and a pressure in the processing chamber 12 was set to 10 mTorr. Intensities of lights having various wavelengths, which are emitted from the plasma during the sputter etching, were measured by using a plasma emission analysis type end point monitor.

Figure 8:
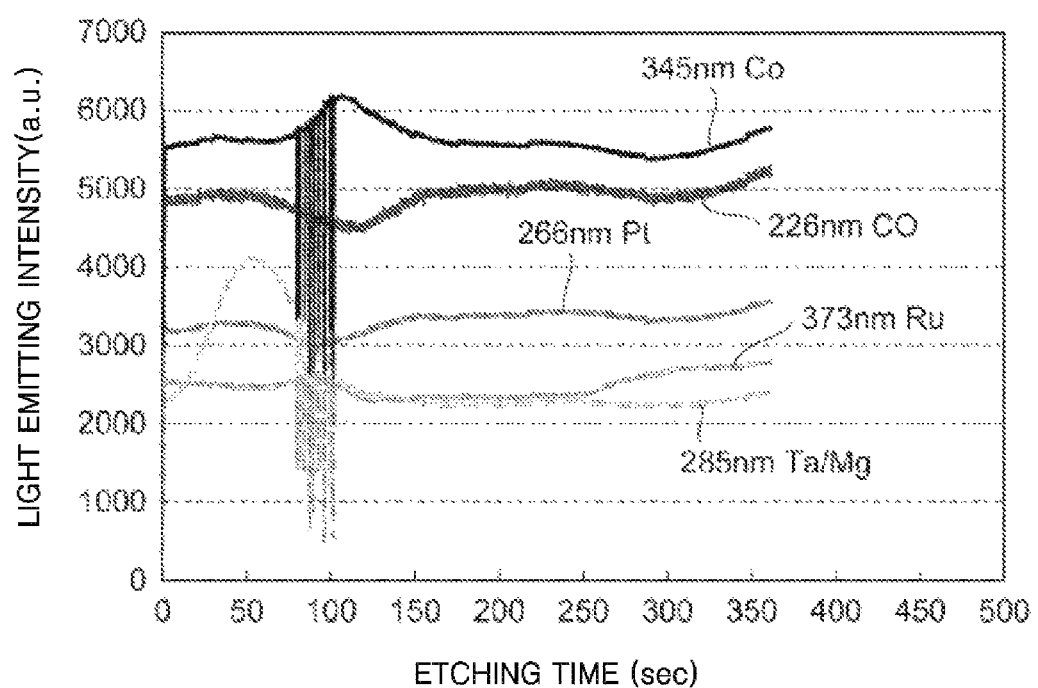
FIG. 8 is a graph showing temporal changes in intensities of lights having various wavelengths during sputter etching for each sample.
Figure 9:
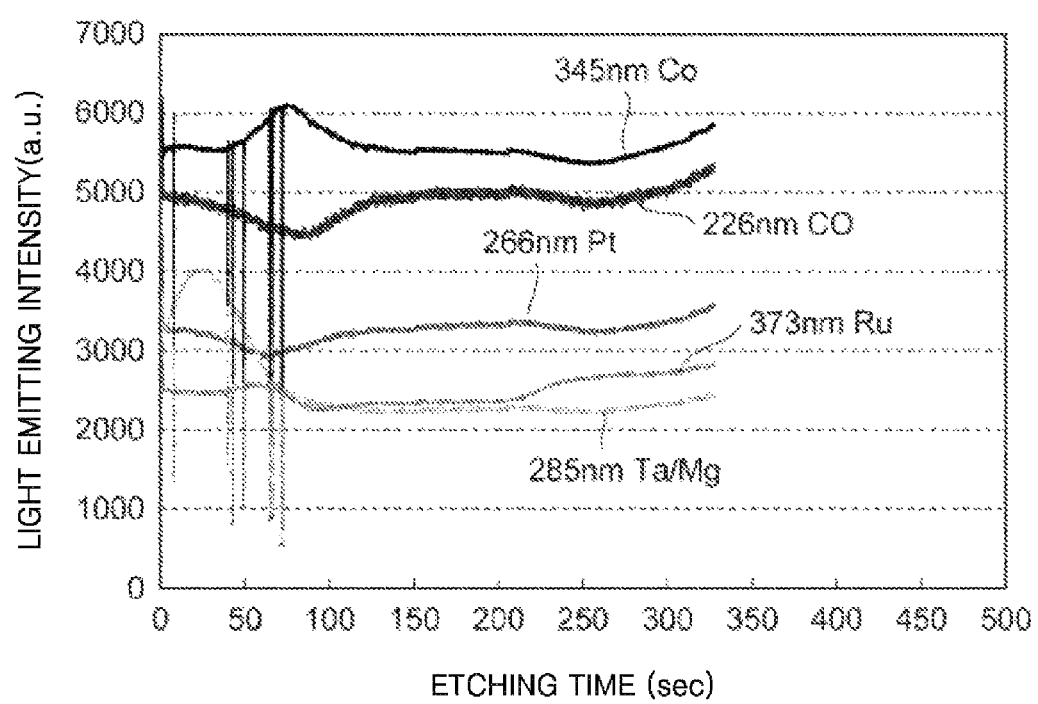
FIG. 9 is a graph showing temporal changes in intensities of lights having various wavelengths during sputter etching for each sample.

FIGS. 8 and 9 are graphs showing temporal changes of the intensities (light emitting intensities) of the light having various wavelengths during the sputter etching of the samples. In the graphs shown in FIGS. 8 and 9, the horizontal axis represents elapsed time from start (0 sec) of the sputter etching and the vertical axis represents the light emitting intensity.

The wavelength 285 nm in the graphs shown in FIGS. 8 and 9 is a wavelength of the light measured in the case of etching Ta and Mg. At the time at which the peak intensity of the light having the wavelength of 285 nm was observed, the etching has reached the twelfth layer L12 containing Mg. The wavelength 345 nm is a wavelength of the light measured in the case of etching Co. At the time at which the peak intensity of the light having the wavelength of 345 nm was observed, the etching has reached an intermediate portion between the sixth layer L6 and the eighth layer L8. A distance between the intermediate portion of the sixth layer L6 and the eighth layer L8 and the insulating film IS is about 31 nm. As shown in FIGS. 8 and 9, the emission intensities of the lights of the respective wavelengths had large variation during a period before the time at which the peak intensity of the light having the wavelength of 345 nm was observed. Such variation is monitored when the separation or the cracking of the multilayer film occurrs. However, such variation was not monitored during a period after the time at which the peak intensity of the light having the wavelength of 345 nm was observed. Therefore, it is clear that the separation and the cracking of the multilayer film can be further suppressed by performing the sputter etching on the multilayer film under a comparatively high pressure condition until the film thickness becomes 31 nm or less and then further etching the multilayer film under a low pressure condition.

DESCRIPTION OF REFERENCE NUMERALS

10: plasma processing apparatus
12: processing chamber
30: upper electrode
PD: mounting table LE: lower electrode
ESC: electrostatic chuck
40: gas source group
42: valve group
44: flow rate controller group
50: gas exhaust unit
62: first high frequency power supply
64: second high frequency power supply
Cnt: control unit
W: wafer
SB: substrate
IS: insulating film
ML: multilayer film
MK: mask
PL: plasma
D: defect

What is claimed is:

1. A method for etching a multilayer film of a target object by using a plasma processing apparatus, the target object comprising an insulating film, the multilayer film is formed on the insulating film and the multilayer film includes a layer made of a metal magnetic material, and a mask is provided on the multilayer film, the method comprising the sequential steps of:

a first step of performing sputter etching on the multilayer film in a state where a pressure in a processing chamber of the plasma processing apparatus is set to a first pressure; and a second step of performing the sputter etching on the multilayer film in a state where a pressure in a processing chamber of the plasma processing apparatus is set to a second pressure lower than the first pressure, wherein a gas-containing defect is generated between the multilayer film and the insulating film by a reaction of active species in a plasma and organic impurities during the sputter etching, and the first pressure is set such that an expansion of the gas-containing defect is suppressed to thereby suppress separation or cracking of the multilayer film, wherein the first step is executed until and stops when a film thickness of the multilayer film becomes 31 nm or less such that a gas in the gas-containing defect leaks from the multilayer film, and wherein the multilayer film is etched to an intermediate depth in a film thickness direction to etch a part of the multilayer film during the first step, and a remaining part of the multilayer film is etched during the second step until the insulating film is exposed, and wherein the first pressure is 2 Pa or above.

2. The method of claim 1, wherein the second pressure is 1.333 Pa or less.

3. The method of claim 1, wherein the insulating film is made of silicon oxide or silicon nitride.

4. The method of claim 1, wherein the multilayer film contains two or more metals selected among Ru, Ta, Pt, Pd, Ti, Mg, Al, Ag, Au, Cu, W, Co, Fe and Ni.

5. The method of claim 1, wherein a mounting table including a lower electrode is provided in the processing chamber, and wherein, in the first step, a high frequency bias power is supplied to the lower electrode in a state where the target object is mounted on the mounting table.

6. The method of claim 1, wherein the first and the second step are performed by a processing gas containing a rare gas and a hydrocarbon-based gas.

7. The method of claim 1, wherein the mask is provided on an uppermost layer of the multilayer film.

* * * * *